(12) United States Patent
Saito et al.

(10) Patent No.: US 7,812,392 B2
(45) Date of Patent: Oct. 12, 2010

(54) SEMICONDUCTOR DEVICE

(75) Inventors: Wataru Saito, Kanagawa-ken (JP); Syotaro Ono, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 300 days.

(21) Appl. No.: 12/138,875

(22) Filed: Jun. 13, 2008

(65) Prior Publication Data
US 2008/0315299 A1  Dec. 25, 2008

(30) Foreign Application Priority Data
Jun. 21, 2007  (JP) .............................. 2007-163791

(51) Int. Cl.
*H01L 29/94* (2006.01)

(52) U.S. Cl. ....................... 257/329; 257/328; 257/330; 257/339; 257/341; 257/343

(58) Field of Classification Search ................. 438/135; 257/110, 124, 136, 367
See application file for complete search history.

(56) References Cited

U.S. PATENT DOCUMENTS

| | | | |
|---|---|---|---|
| 6,475,864 B1 * | 11/2002 | Sato et al. ..................... | 438/268 |
| 6,512,268 B1 * | 1/2003 | Ueno .......................... | 257/341 |
| 6,844,592 B2 | 1/2005 | Yamaguchi et al. | |
| 7,009,239 B2 | 3/2006 | Tokuda et al. | |
| 7,115,475 B2 | 10/2006 | Yamaguchi et al. | |
| 7,224,022 B2 | 5/2007 | Tokano et al. | |
| 2005/0199905 A1 | 9/2005 | Komachi | |
| 2006/0017096 A1 | 1/2006 | Yanagisawa et al. | |
| 2007/0221950 A1 | 9/2007 | Suzuki et al. | |
| 2007/0272977 A1 | 11/2007 | Saito et al. | |

FOREIGN PATENT DOCUMENTS

| | | |
|---|---|---|
| JP | 8-264787 | 10/1996 |
| JP | 2000-277726 | 10/2000 |
| JP | 2002-170955 | 6/2002 |
| JP | 2005-136099 | 5/2005 |
| JP | 2006-173202 | 6/2006 |

* cited by examiner

*Primary Examiner*—N Drew Richards
*Assistant Examiner*—Kyoung Lee
(74) *Attorney, Agent, or Firm*—Oblon, Spivak, McClelland, Maier & Neustadt, L.L.P.

(57) ABSTRACT

A semiconductor device includes a first first-conductivity-type semiconductor layer, a second first-conductivity-type semiconductor layer provided on a major surface of the first first-conductivity-type semiconductor layer; a third second-conductivity-type semiconductor layer being adjacent to the second first-conductivity-type semiconductor layer, provided on the major surface of the first first-conductivity-type semiconductor layer, and forming a periodic array structure in combination with the second first-conductivity-type semiconductor layer in a horizontal direction generally parallel to the major surface of the first first-conductivity-type semiconductor layer, and a sixth semiconductor layer located outside and adjacent to the periodic array structure of the second first-conductivity-type semiconductor layer and the third second-conductivity-type semiconductor layer, provided on the major surface of the first first-conductivity-type semiconductor layer, and having a lower impurity concentration than the periodic array structure. The amount of impurity in the outermost semiconductor layer of the first conductivity type or the second conductivity type adjacent to the sixth semiconductor layer in the periodic array structure is generally half the amount of impurity in the second first-conductivity-type semiconductor layer or the third second-conductivity-type semiconductor layer inside the outermost semiconductor layer.

20 Claims, 12 Drawing Sheets

SEMICONDUCTOR DEVICE

CROSS-REFERENCE TO RELATED APPLICATIONS

This application is based upon and claims the benefit of priority from the prior Japanese Patent Application No. 2007-163791, filed on Jun. 21, 2007; the entire contents of which are incorporated herein by reference.

BACKGROUND OF THE INVENTION

1. Field of the Invention

This invention relates to a semiconductor device.

2. Background Art

The on-resistance of a vertical power MOSFET (metal-oxide-semiconductor field effect transistor) greatly depends on the electric resistance of its conduction layer (drift layer). The dopant concentration that determines the electric resistance of the drift layer cannot exceed a maximum limit, which depends on the breakdown voltage of the p-n junction formed between the base region and the drift layer. Thus there is a tradeoff between the device breakdown voltage and the on-resistance. Improving this tradeoff is important for low power consumption devices. This tradeoff has a limit determined by the device material. Overcoming this limit is the way to realizing devices with low on-resistance beyond existing power devices.

As an example MOSFET to solve this problem, a structure with p-type pillar layers and n-type pillar layers provided in the drift layer is known as a superjunction structure. In the superjunction structure, a non-doped layer is artificially produced by equalizing the amount of charge (amount of impurity) contained in the p-type pillar layer with that contained in the n-type pillar layer. Thus, while holding high breakdown voltage, a current is passed through the highly doped n-type pillar layer. Hence, a low on-resistance beyond the material limit is realized. In order to hold high breakdown voltage, the amount of impurity in the n-type pillar layer and the p-type pillar layer needs to be accurately controlled.

Such a MOSFET having a superjunction structure in the drift layer is different also in the design of its termination structure from normal power MOSFETs. Like the cell section, the termination section also needs to hold high breakdown voltage. In the case where the termination section also includes a superjunction structure, variation in the amount of impurity also results in decreased termination breakdown voltage, and hence decreased device breakdown voltage. To solve this, in a structure disclosed in JP-A 2000-277726(Kokai), for example, the termination section is formed from a high-resistance layer without including a superjunction structure to increase the termination breakdown voltage.

However, the termination formed from a high-resistance layer has a low impurity concentration, and hence the depletion layer is easy to extend therein. Thus, the termination distance needs to be lengthened so that the depletion layer does not reach the dicing line. Comparing at the same chip size, a longer termination distance results in decreasing the effective area ratio of the chip and increasing the on-resistance of the chip. To realize the same chip on-resistance with the long termination distance left unchanged, the chip size needs to be increased. This decreases the number of chips that can be formed in one wafer and increases the chip cost.

Furthermore, in this structure, the superjunction structure is discontinuous between the cell section and the termination section. Upon application of high voltage, the depletion layer does not extend from the high-resistance layer to the superjunction structure. Hence, the impurity concentration in the p-type pillar layer or the n-type pillar layer at the outermost portion of the cell section superjunction structure, where the discontinuity exists, needs to be approximately half that in the cell section. Concentration variation in the outermost pillar layer results in decreased breakdown voltage, like variation in the amount of impurity in the pillar layer of the cell section. Hence, the amount of impurity requires the same controllability as in the other pillar layers.

SUMMARY OF THE INVENTION

According to an aspect of the invention, there is provided a semiconductor device including: a first first-conductivity-type semiconductor layer; a second first-conductivity-type semiconductor layer provided on a major surface of the first first-conductivity-type semiconductor layer; a third second-conductivity-type semiconductor layer being adjacent to the second first-conductivity-type semiconductor layer, provided on the major surface of the first first-conductivity-type semiconductor layer, and forming a periodic array structure in combination with the second first-conductivity-type semiconductor layer in a horizontal direction generally parallel to the major surface of the first first-conductivity-type semiconductor layer; a first main electrode electrically connected to the first first-conductivity-type semiconductor layer; a fourth second-conductivity-type semiconductor region provided on the third second-conductivity-type semiconductor layer; a fifth first-conductivity-type semiconductor region selectively provided in a surface of the fourth second-conductivity-type semiconductor region; a second main electrode provided in contact with the fifth first-conductivity-type semiconductor region and the fourth second-conductivity-type semiconductor region; a control electrode provided on the fifth first-conductivity-type semiconductor region, the fourth second-conductivity-type semiconductor region, and the second first-conductivity-type semiconductor layer via an insulating film; a sixth semiconductor layer located outside and adjacent to the periodic array structure of the second first-conductivity-type semiconductor layer and the third second-conductivity-type semiconductor layer, provided on the major surface of the first first-conductivity-type semiconductor layer, and having a lower impurity concentration than the periodic array structure; and a trench being adjacent to the sixth semiconductor layer and having a bottom reaching the first first-conductivity-type semiconductor layer, the amount of impurity in the outermost semiconductor layer of the first conductivity type or the second conductivity type adjacent to the sixth semiconductor layer in the periodic array structure being generally half the amount of impurity in the second first-conductivity-type semiconductor layer or the third second-conductivity-type semiconductor layer inside the outermost semiconductor layer.

DETAILED DESCRIPTION OF THE INVENTION

Embodiments of the invention will now be described with reference to the drawings, taking a MOSFET as an example semiconductor device. In the following embodiments, it is assumed that the first conductivity type and the second conductivity type are n-type and p-type, respectively. Like elements in the drawings are labeled with like reference numerals.

First Embodiment

Figure 1:
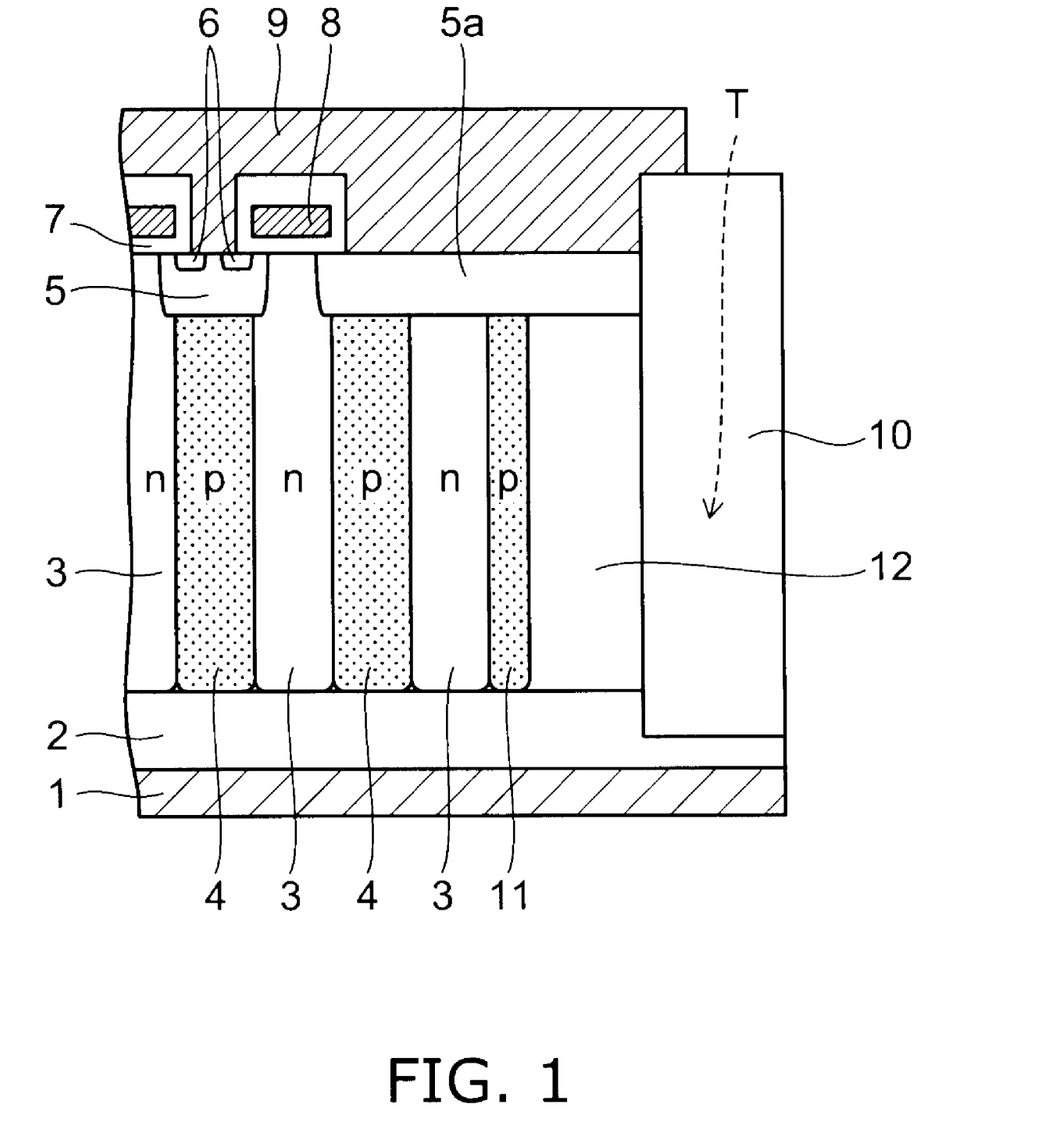
FIG. 1 is a cross-sectional view schematically showing the configuration of a semiconductor device according to a first embodiment of the invention.

FIG. 1 is a cross-sectional view schematically showing the configuration of a semiconductor device according to a first embodiment of the invention.

The semiconductor device according to this embodiment is a vertical device in which a main current path is formed in the vertical direction connecting between a first main electrode and a second main electrode, which are provided on the frontside and the backside of the semiconductor layer, respectively. The semiconductor device according to this embodiment comprises a cell section in which the main current path is formed and a termination section surrounding outside the cell section.

On the major surface of a drain layer 2 serving as a first first-conductivity-type semiconductor layer of $n^+$-type silicon having a high impurity concentration, n-type pillar layers 3 of n-type silicon serving as second first-conductivity-type semiconductor layers and p-type pillar layers 4 of p-type silicon serving as third second-conductivity-type semiconductor layers are provided.

The n-type pillar layers 3 and the p-type pillar layers 4 are periodically arrayed, alternately adjacent to (in p-n junction with) each other in the horizontal direction generally parallel to the major surface of the drain layer 2, constituting a so-called "superjunction structure". The bottom of the n-type pillar layer 3 is in contact with the drain layer 2 and constitutes part of the main current path during on-state.

The planar pattern of the periodic array structure (superjunction structure) of the n-type pillar layers 3 and the p-type pillar layers 4 is illustratively a striped configuration. However, it is not limited thereto, but can be formed in a lattice or staggered configuration.

The process for forming the superjunction structure is not particularly limited. For example, the superjunction structure can be formed by a process including crystal growth of a high-resistance semiconductor layer on the major surface of the drain layer 2, ion implantation of p-type dopant and n-type dopant in the surface of the high-resistance semiconductor layer, and repeating crystal growth of a high-resistance semiconductor layer; a process of ion implantation into a high-resistance semiconductor layer with the acceleration voltage varied; and a process of forming trenches in a high-resistance semiconductor layer and filling the trenches with n-type semiconductor layers and p-type semiconductor layers.

A base region 5 of p-type silicon is provided as a fourth second-conductivity-type semiconductor region on the p-type pillar layer 4 in the cell section. Like the p-type pillar layer 4, the base region 5 is adjacent to and in p-n junction with the n-type pillar layer 3. A source region 6 of $n^+$-type silicon is selectively provided as a fifth first-conductivity-type semiconductor layer in the surface of the base region 5.

A gate insulating film 7 is provided on the portion extending from the n-type pillar layer 3 through the base region 5 to the source region 6. The gate insulating film 7 is illustratively a silicon oxide film having a thickness of approximately 0.1 µm. A control electrode (gate electrode) 8 is provided on the gate insulating film 7.

A source electrode 9 is provided as a second main electrode on part of the source regions 6 and the portion of the base region 5 located between the source regions 6. The source electrode 9 is in contact with and electrically connected to the source region 6 and the base region 5. At the surface on the opposite side of the major surface of the drain layer 2, a drain electrode 1 is provided as a first main electrode and electrically connected to the drain layer 2.

When a prescribed voltage is applied to the control electrode 8, a channel is produced near the surface of the base region 5 directly below the control electrode 8, establishing electrical continuity between the source region 6 and the n-type pillar layer 3. Consequently, a main current path is produced between the source electrode 9 and the drain electrode 1 through the source region 6, the n-type pillar layer 3, and the drain layer 2, turning on this semiconductor device.

On the major surface of the drain layer 2 outside the superjunction structure is provided a high-resistance layer 12 as a sixth semiconductor layer adjacent to the superjunction structure. The impurity concentration in the high-resistance layer 12 is lower than the impurity concentration in the superjunction structure.

In the superjunction structure in the cell section, each pillar layer forms p-n junction with both adjacent pillar layers having the opposite conductivity type. Hence, upon application of high voltage to the drain electrode 1, depletion layers extend from both sides of each pillar layer, allowing a high breakdown voltage to be held.

In contrast, the outermost pillar layer 11, which is the outermost semiconductor layer of the superjunction structure, is adjacent to only one (inside) pillar layer to form p-n junction therewith, and the impurity concentration in the high-resistance layer 12 located outside is lower than the impurity concentration in the superjunction structure. Hence, the depletion layer does not extend from the high-resistance layer 12 to the outermost pillar layer 11, but only extends from the outermost pillar layer 11 to the high-resistance layer 12.

Thus, the amount of impurity in the outermost pillar layer 11 adjacent to the high-resistance layer 12 is designed to be generally half the amount of impurity in the n-type pillar layer 3 or the p-type pillar layer 4 inside (on the cell section side of) the outermost pillar layer 11. The term "amount of impurity" used herein refers to the product of impurity concentration ($cm^{-3}$) and the width of the pillar layer (the width in the horizontal direction generally parallel to the major surface of the drain layer 2).

In the superjunction structure, a high breakdown voltage can be held when the impurity concentration in the p-type pillar layer is comparable to the impurity concentration in the n-type pillar layer. If the balance in impurity concentration is lost between the p-type pillar layer and the n-type pillar layer, that is, if the p-type pillar layer or the n-type pillar layer has a higher impurity concentration, the breakdown voltage decreases. However, in view of processing variation, some decrease of breakdown voltage is assumed to be acceptable. For example, to restrict the decrease of breakdown voltage to approximately 50 V for 600 V class devices, variation in impurity concentration between the p-type pillar layer and the n-type pillar layer needs to be restricted to within the range of approximately ±10%. From this viewpoint, the term "generally half" mentioned above means that the amount of impurity in the outermost pillar layer 11 is 50%±10%, or 40 to 60%, of the amount of impurity in the n-type pillar layer 3 or the p-type pillar layer 4. If the amount of impurity in the outermost pillar layer 11 is less than 40% of the amount of impurity in the inner pillar layer (the n-type pillar layer 3 or the p-type pillar layer 4), the depletion layer cannot extend from the outermost pillar layer 11 to the inner pillar layer adjacent thereto, failing to maintain high breakdown voltage. On the other hand, if the amount of impurity in the outermost pillar layer 11 is greater than 60% of the amount of impurity in the inner pillar layer, the depletion layer cannot extend from the adjacent inner pillar layer to the outermost pillar layer 11, also failing to maintain high breakdown voltage.

In the termination section provided with the high-resistance layer 12, a trench T is formed adjacent to the high-resistance layer 12. The trench T opens to the surface of the termination section including the high-resistance layer 12, and its bottom reaches the drain layer 2 (in the example shown, the bottom of the trench T is located deeper than the major surface of the drain layer 2). The trench T is filled with an insulator 10.

The high-resistance layer 12 is adjacent to the trench T and the insulator 10 therein. The outermost base region 5a, which is the outermost one of the base regions 5, is provided also on the surface of the high-resistance layer 12, and the end of the outermost base region 5a is in contact with the trench T and the insulator 10 therein. That is, in this structure, the trench T and the insulator 10 provided at the termination completely insulate the device located inside. This eliminates the need to provide a termination structure for holding high voltage by extending the depletion layer vertically and horizontally, allowing significant reduction of the termination distance. For example, the conventional 600 V class power MOSFET requires a termination distance of approximately 200 μm. In contrast, the termination in the structure of this embodiment only needs the width of the trench T at minimum, and the termination distance can be decreased to e.g. 10 μm or less.

The insulator 10 can be made of any material such as silicon oxide, silicon nitride, and a composite film thereof, as long as it has low leakage current and is resistant to breakdown under high voltage.

For example, in the case where the insulator 10 is made of silicon oxide and the trench T is entirely filled therewith, the substrate may warp due to the difference in thermal expansion coefficient between silicon oxide and silicon. From the viewpoint of preventing this warpage, the insulator 10 for filling the trench T is preferably made of a composite film of silicon oxide and silicon nitride. Alternatively, a silicon oxide film is formed by thermal oxidation on the inner wall (sidewall and bottom) of the trench T, and the remaining portion of the trench T is filled with a nonuniform granular material (silicon oxide, silicon nitride, or alumina), which is then sintered. This can also prevent substrate warpage.

Figure 2:
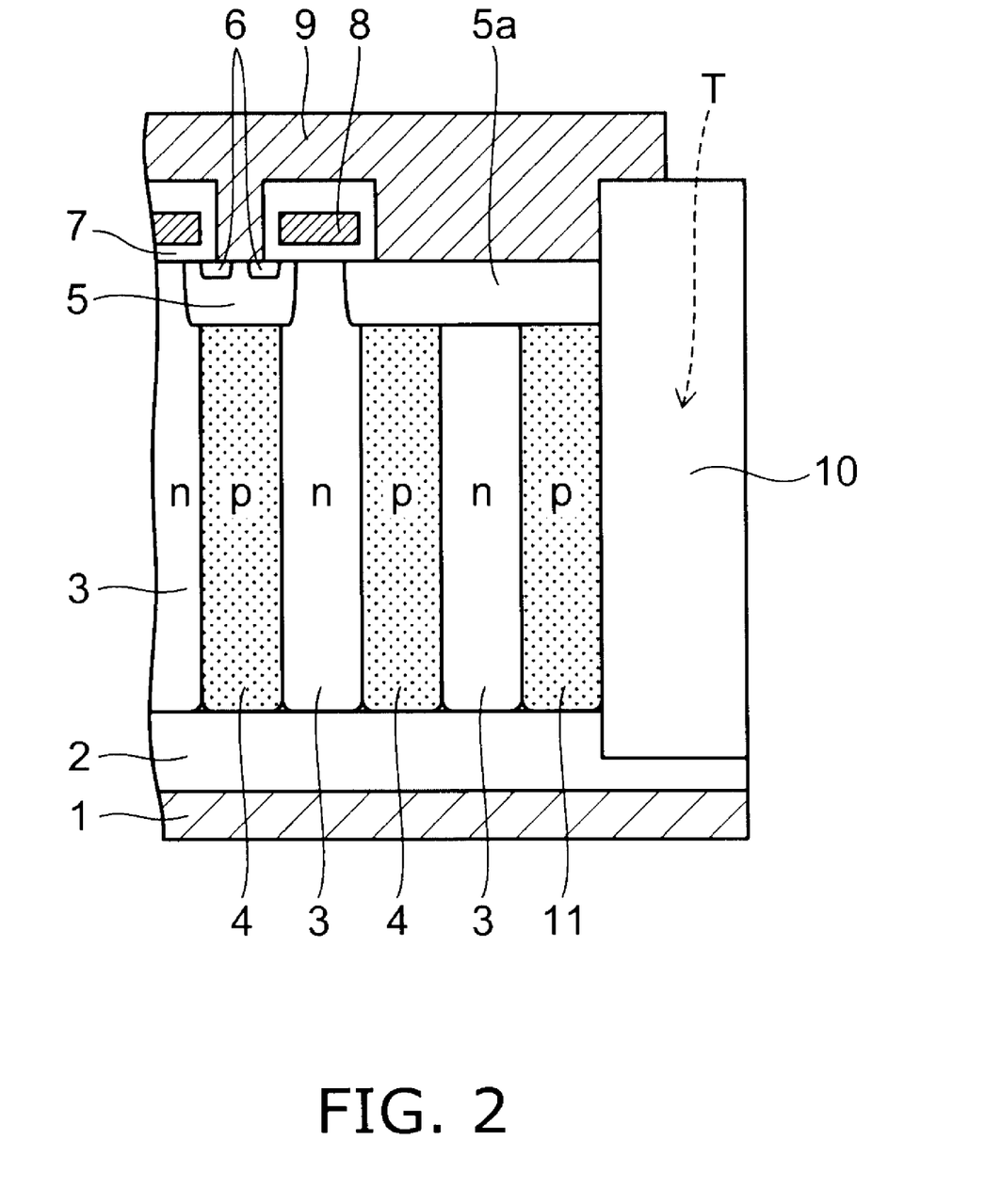
FIG. 2 is a cross-sectional view schematically showing the configuration of a semiconductor device of a comparative example.
Figure 3:
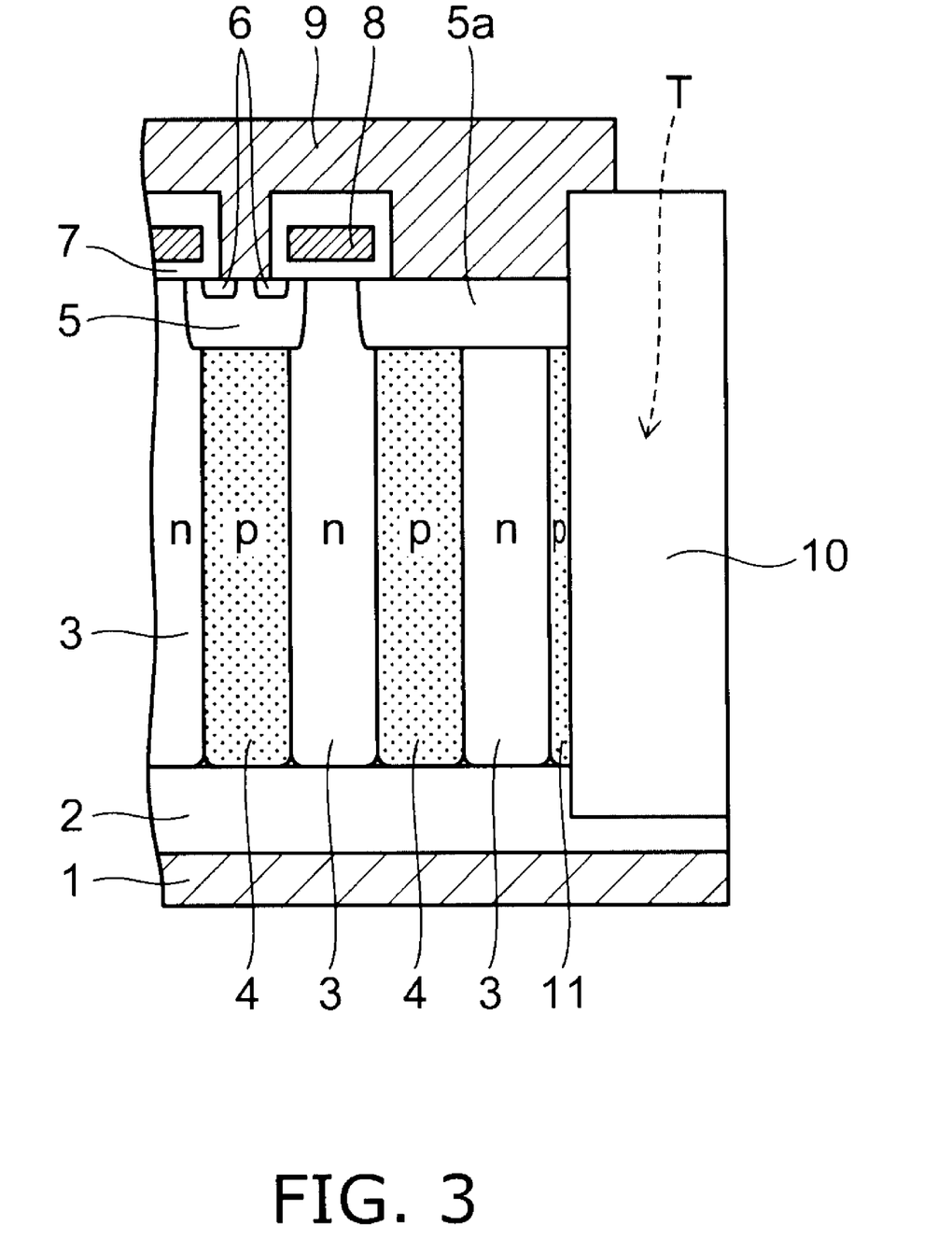
FIG. 3 is a cross-sectional view schematically showing the configuration of a semiconductor device of another comparative example.

Here, as a comparative example, assuming that a trench T is formed without a high-resistance layer 12, the trench T is in contact with the outermost pillar layer 11 as shown in FIGS. 2 and 3. The position for forming the trench T depends on lithographic alignment. In view of controllability, it is convenient to regulate the amount of impurity in the outermost pillar layer 11 by its width. In that case, as described above, the trench T can be formed at a position where the amount of impurity in the outermost pillar layer 11, or its width, is half the n-type pillar layer 3 or the p-type pillar layer 4 located inside. However, misalignment of the trench T as shown in FIGS. 2 and 3 causes variation in the width of the outermost pillar layer 11, or the amount of impurity therein. Variation in the amount of impurity in the outermost pillar layer 11 results in decreased breakdown voltage, like variation in the amount of impurity in the pillar layer of the cell section at the center of the device.

In this embodiment, a high-resistance layer 12 is formed between the outermost pillar layer 11 and the trench T. Hence, the trench T is formed in contact with the high-resistance layer 12. In this case, the trench formation process does not require high positional precision, and the amount of impurity in the outermost pillar layer 11 does not depend on the precision of the process for forming the trench T. Thus, the decrease of breakdown voltage due to variation in the amount of impurity in the outermost pillar layer 11 can be prevented.

As described above, in the semiconductor device according to this embodiment, the device termination is isolated by the trench T to restrict horizontal extension of the depletion layer at the termination. The decrease of breakdown voltage due to variation in the amount of impurity in the superjunction structure can be reduced. Thus, the termination distance can be reduced while holding stable, high breakdown voltage. Furthermore, a high-resistance layer 12 is formed between the outermost pillar layer 11 and the trench T to prevent variation in the amount of impurity in the outermost pillar layer 11, achieving high breakdown voltage in the termination section.

While FIG. 1 shows an example in which the outermost pillar layer 11 is a p-type pillar layer, the outermost pillar layer 11 can be made of an n-type pillar layer instead. Furthermore, the high-resistance layer 12 can be of either p-type or n-type. It is preferable that its impurity concentration be approximately 1/100 to 1/10 of the impurity concentration in the p-type pillar layer 4 and the n-type pillar layer 3.

In the following, other embodiments of the invention are described. The same elements as those in the above embodiment are labeled with like reference numerals, and the detailed description thereof is omitted.

Second Embodiment

Figure 4:
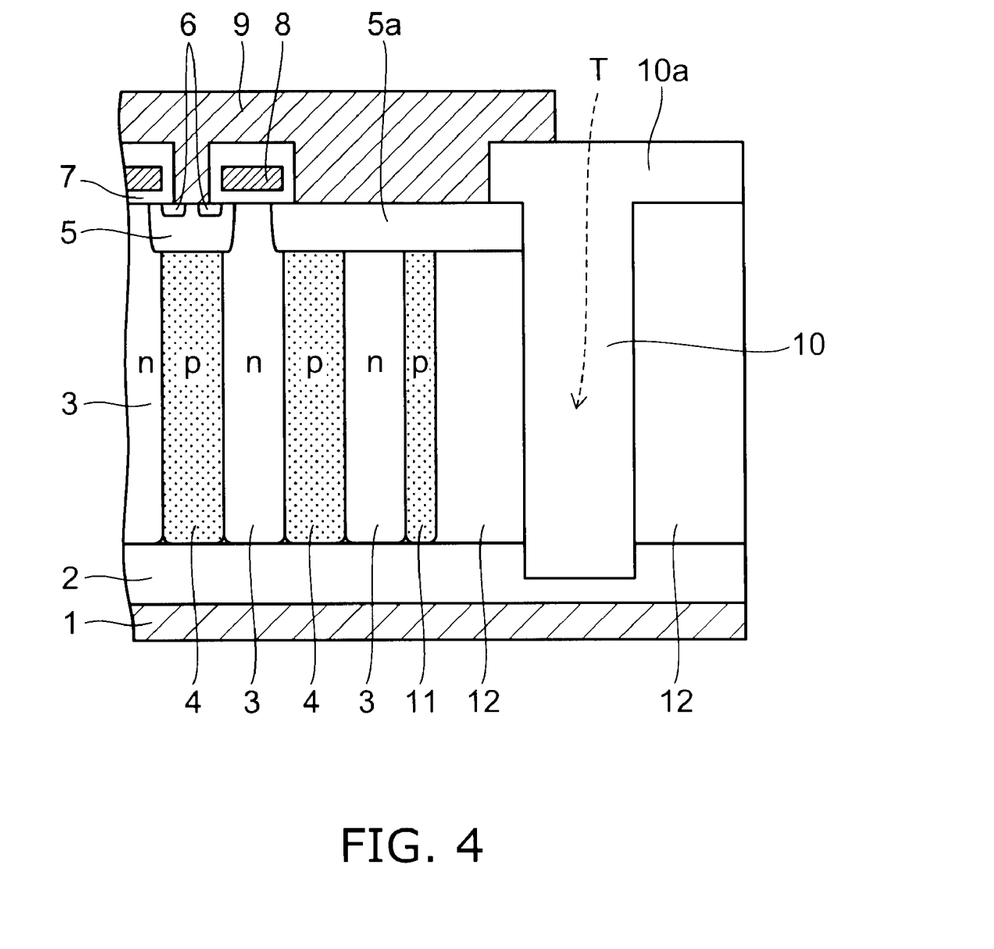
FIG. 4 is a cross-sectional view schematically showing the configuration of a semiconductor device according to a second embodiment of the invention.

FIG. 4 is a cross-sectional view schematically showing the configuration of a semiconductor device according to a second embodiment of the invention.

In the structure shown in FIG. 4, the high-resistance layer 12 is provided on the major surface of the drain layer 2 also outside (on the device termination side of) the trench T filled with the insulator 10. The structure described above is formed in a wafer, and then diced into chips. At this time, dicing at the trench T filled with the insulator 10 imposes mechanical stress on the trench T. This may damage the sidewall of the trench T and result in decreased breakdown voltage and increased leakage current.

In this embodiment, the high-resistance layer 12 left outside the trench T is subjected to dicing. Thus, no stress is imposed on the trench T, allowing prevention of decreased breakdown voltage and increased leakage current.

Figure 5:
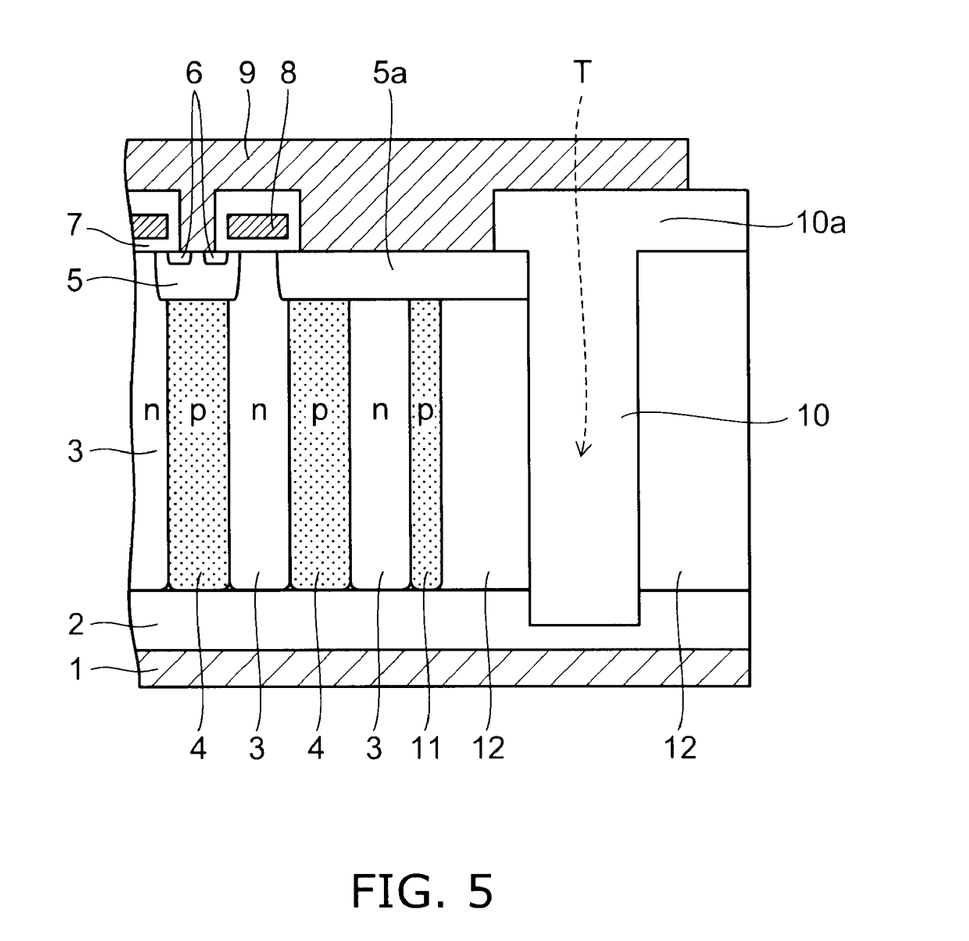
FIG. 5 is a schematic cross-sectional view showing another example of the semiconductor device according to the second embodiment.

The outside of the trench T is equipotential to the drain electrode 1. Hence, a voltage is applied also horizontally to the trench T. In this case, if the width of the trench T is approximately several μm, the horizontal electric field is not negligible. Thus, the electric field increases at the end of the outermost base region 5a, and the breakdown voltage tends to decrease. However, as shown in FIG. 5, the source electrode 9 can be formed to the outside of the trench T to reduce electric field concentration at the end of the outermost base region 5a and prevent the decrease of breakdown voltage. Conversely, the width of the trench T can be decreased as compared with FIG. 4, resulting in overall downsizing of the device. It is noted that part of the insulating film 10 is provided also above the opening end of the trench T and serves as a field insulating film 10a interposed between the source electrode 9 and the termination surface including the trench T and the high-resistance layer 12. Naturally, it is also possible to form the insulator 10 filling the trench T and the field insulating film 10a in different processes and from different materials.

Third Embodiment

Figure 6:
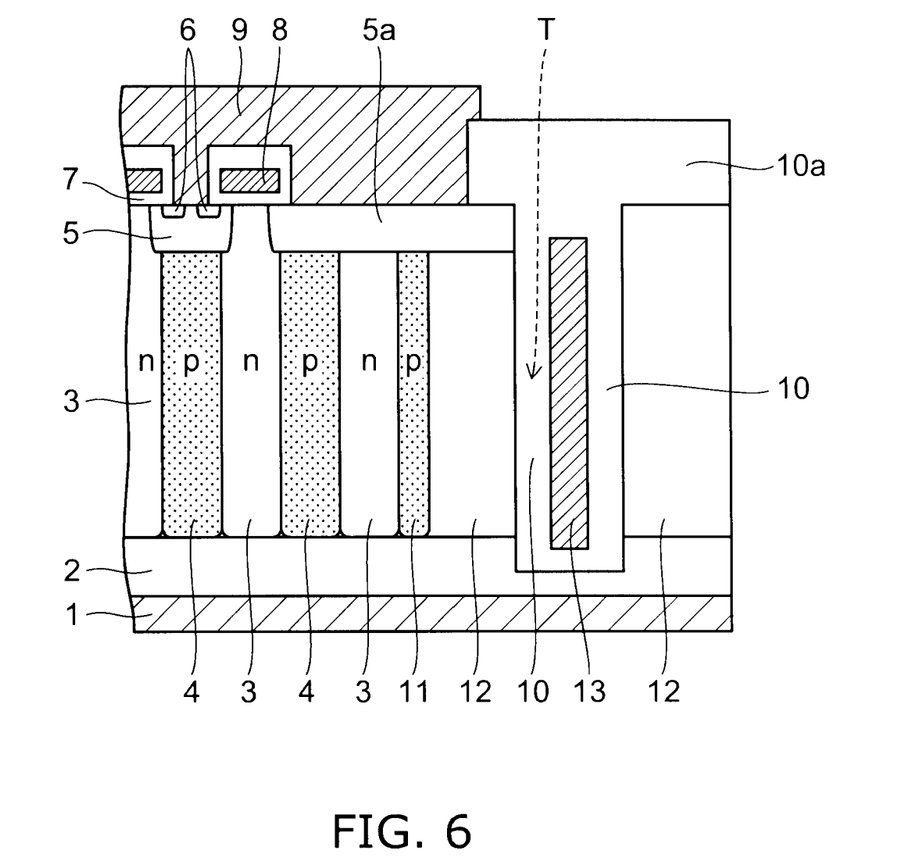
FIG. 6 is a cross-sectional view schematically showing the configuration of a semiconductor device according to a third embodiment of the invention.

FIG. 6 is a cross-sectional view schematically showing the configuration of a semiconductor device according to a third embodiment of the invention.

In the structure shown in FIG. 6, an insulator 10 is provided on the inner wall (sidewall and bottom) of the trench T, and the inside of the insulator 10 in the trench T is filled with polycrystalline silicon 13. The trench T having a large width is subjected to stress due to the difference in thermal expansion coefficient between silicon and the insulator 10 illustratively made of silicon oxide, which may warp the substrate. In this embodiment, polycrystalline silicon 13 is used in combination with the insulator 10 as a filler in the trench T to relatively reduce the film thickness (horizontal thickness) in the trench T, allowing reduction of warpage.

Furthermore, the polycrystalline silicon 13 is not connected to the other electrodes to serve as a floating electrode, and hence is placed at an intermediate potential between the drain potential and the source potential. This can alleviate the voltage applied to the insulator 10, and the insulator 10 can be thinned by that amount. Furthermore, the polycrystalline silicon 13, which is placed at an intermediate potential between the drain potential and the source potential, is opposed across the insulator 10 to the junction interface between the outermost base region 5a and the high-resistance layer 12 and to the boundary between the high-resistance layer 12 and the drain layer 2. This configuration serves to reduce horizontal electric field in the termination section and hold high breakdown voltage.

The thickness of the insulator 10 formed on the sidewall of the trench T depends on the device breakdown voltage, and is preferably determined so that the electric field in the insulator 10 is approximately 1 to 2 MV/cm in order to prevent decreased breakdown voltage and insulation breakdown to achieve high reliability. Because the polycrystalline silicon 13 serves as a floating electrode, approximately half the drain voltage, e.g., 300 V for a 600 V class power MOSFET, is applied to the insulator 10. Hence, it is preferable that the thickness of the insulator 10 on the sidewall of the trench T be approximately 1.5 to 3 μm.

The polycrystalline silicon 13 in the trench T can be formed simultaneously with polycrystalline silicon constituting the control electrode 8 in the cell section to shorten the process.

Figure 7:
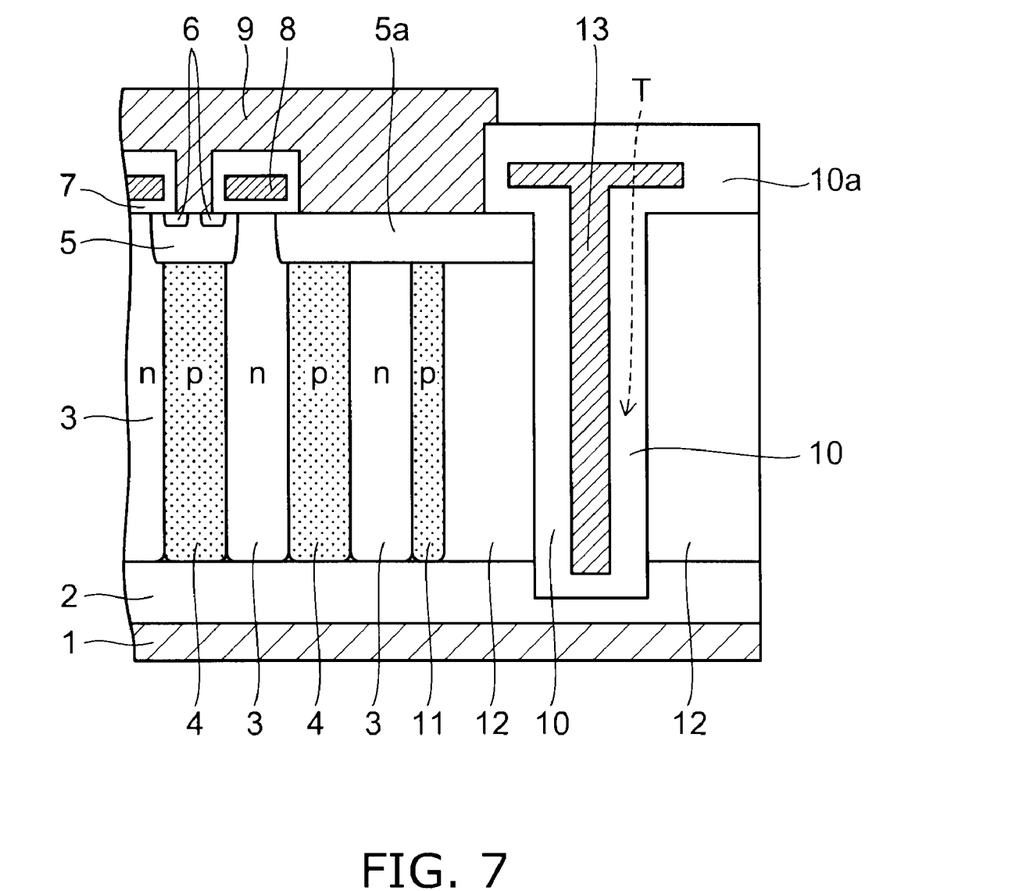
FIG. 7 is a schematic cross-sectional view showing another example of the semiconductor device according to the third embodiment.

Furthermore, as shown in FIG. 7, the polycrystalline silicon 13 can be provided in the field insulating film 10a, which is provided above the opening end of the trench T and on the surface of the termination section including the trench T and the high-resistance layer 12. This enhances the capacitive coupling of the polycrystalline silicon 13 to the source electrode 9 and the drain electrode 1 to ensure that the polycrystalline silicon 13 has an intermediate potential between the source and the drain, preventing electric field concentration at the termination and achieving stable operation. A typical method for providing the polycrystalline silicon 13 only in the trench T includes depositing polycrystalline silicon 13 also above the opening end of the trench T and etching back the unwanted portion thereof. However, the structure of FIG. 7 does not need the etch-back for leaving polycrystalline silicon 13 only in the trench T.

Figure 8:
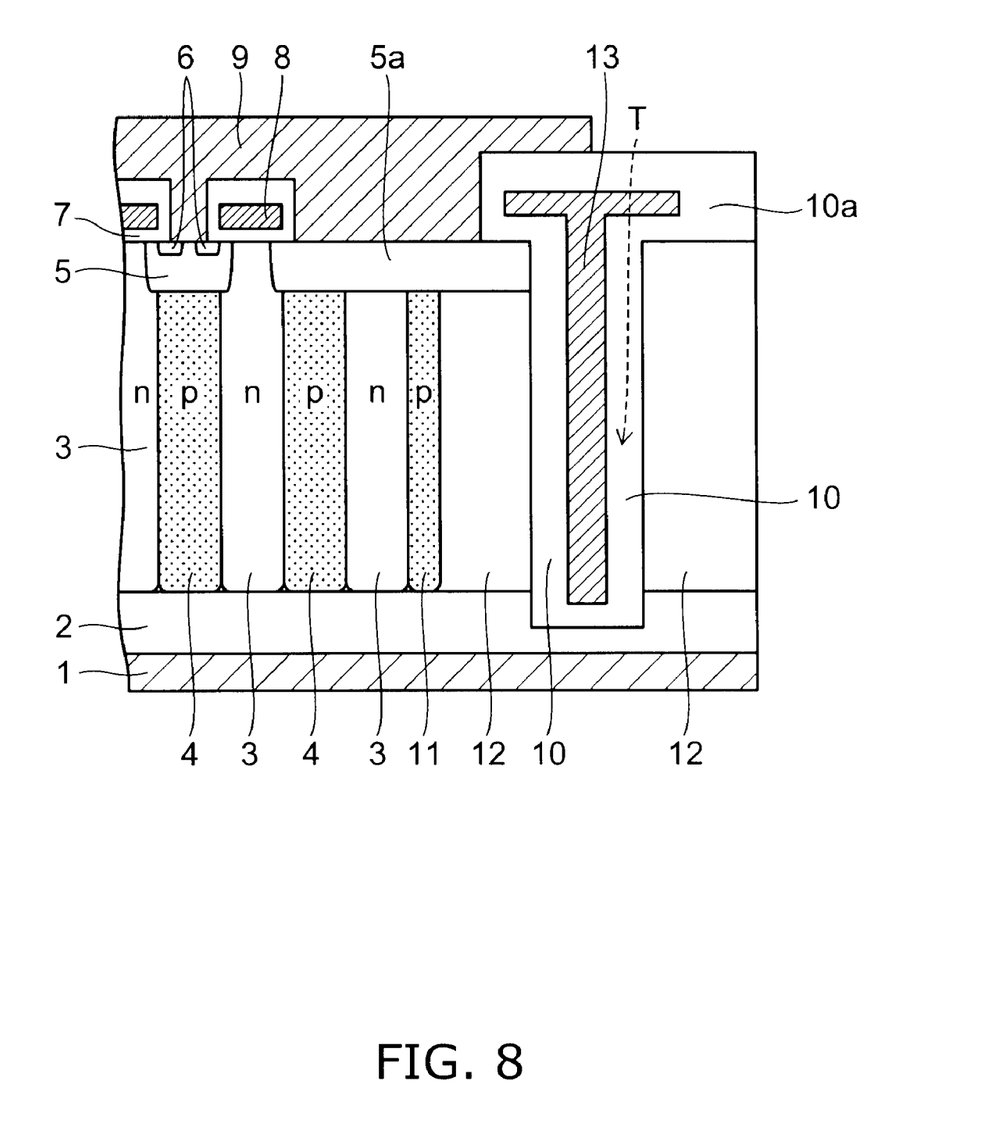
FIG. 8 is a schematic cross-sectional view showing still another example of the semiconductor device according to the third embodiment.

Furthermore, as shown in FIG. 8, the source electrode 9 is allowed to cover the polycrystalline silicon 13 via the field insulating film 10a to further increase the capacitive coupling between the polycrystalline silicon 13 and the source electrode 9.

Fourth Embodiment

Figure 9:
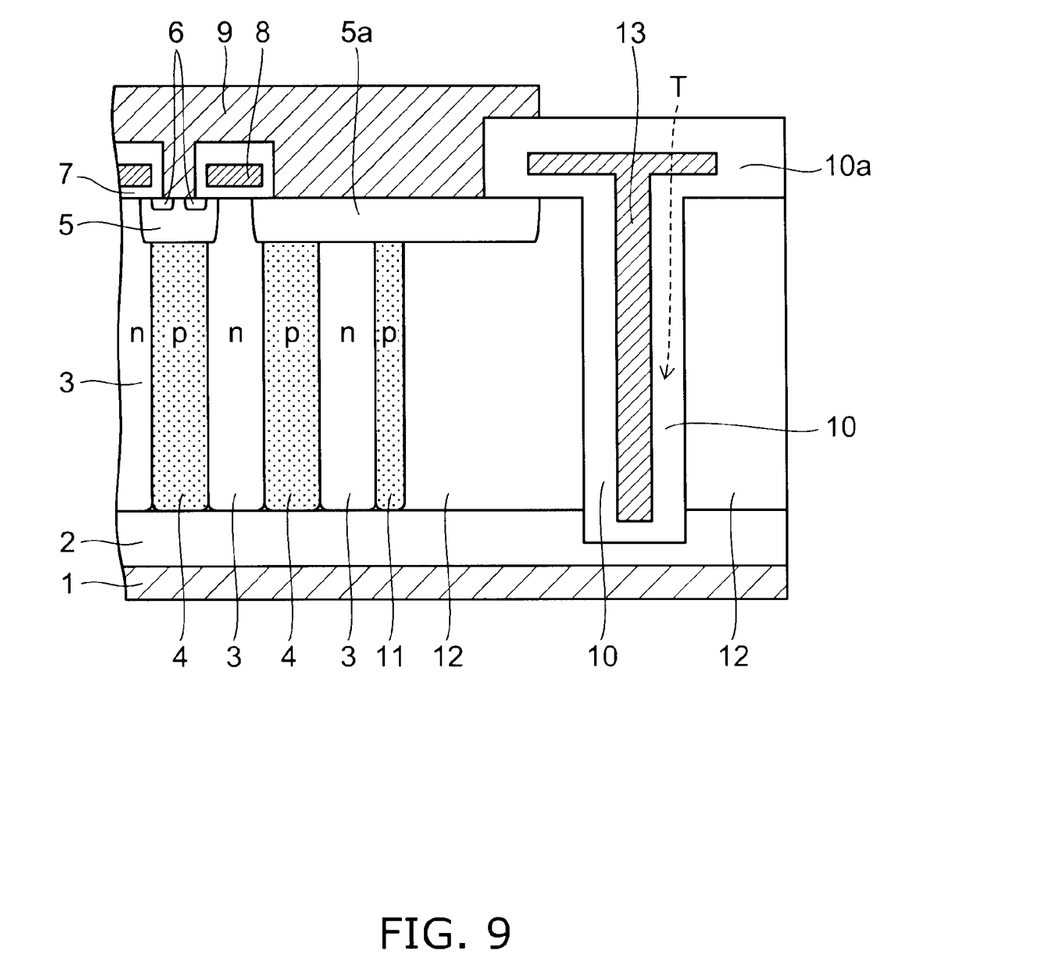
FIG. 9 is a cross-sectional view schematically showing the configuration of a semiconductor device according to a fourth embodiment of the invention.

FIG. 9 is a cross-sectional view schematically showing the configuration of a semiconductor device according to a fourth embodiment of the invention.

In the structure shown in FIG. 9, the outermost base region 5a is not in contact with the trench T. Hence, electric field concentration is more likely to occur at the end of the outermost base region 5a than in the above-described structure in which the outermost base region 5a is in contact with the trench T. However, because the polycrystalline silicon 13 in the field insulating film 10a is provided so as to cover the end of the outermost base region 5a, electric field concentration at the end of the outermost base region 5a can be prevented to hold high breakdown voltage.

Fifth Embodiment

Figure 10:
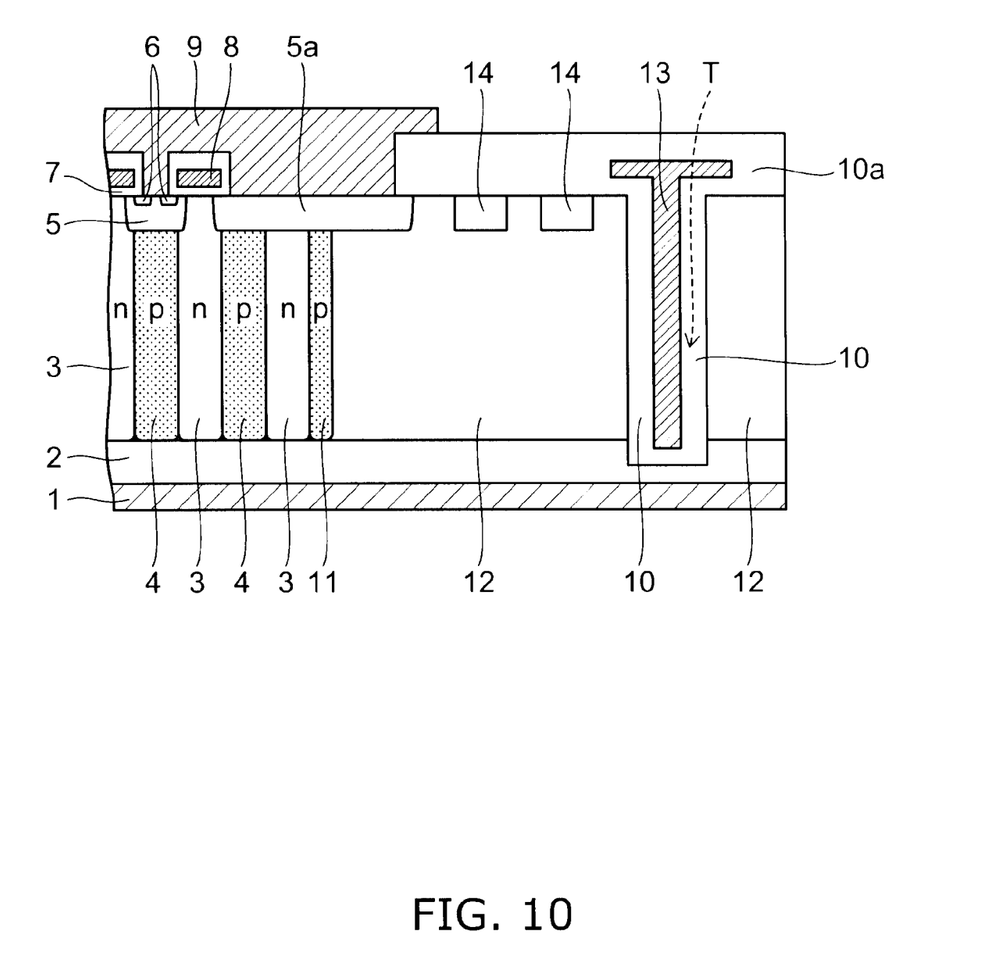
FIG. 10 is a cross-sectional view schematically showing the configuration of a semiconductor device according to a fifth embodiment of the invention.

FIG. 10 is a cross-sectional view schematically showing the configuration of a semiconductor device according to a fifth embodiment of the invention.

In the structure shown in FIG. 10, a guard ring layer 14 made of a p-type semiconductor is formed in the surface of the high-resistance layer 12 outside the outermost base region 5a, and the trench T is formed outside the guard ring layer 14. The guard ring layer 14 alleviates electric field concentration in the outermost base region 5a and decreases the voltage applied to the trench T. Hence, by that amount, the thickness of the insulator 10 formed on the sidewall of the trench T can be decreased, and warpage can be prevented.

Sixth Embodiment

Figure 11:
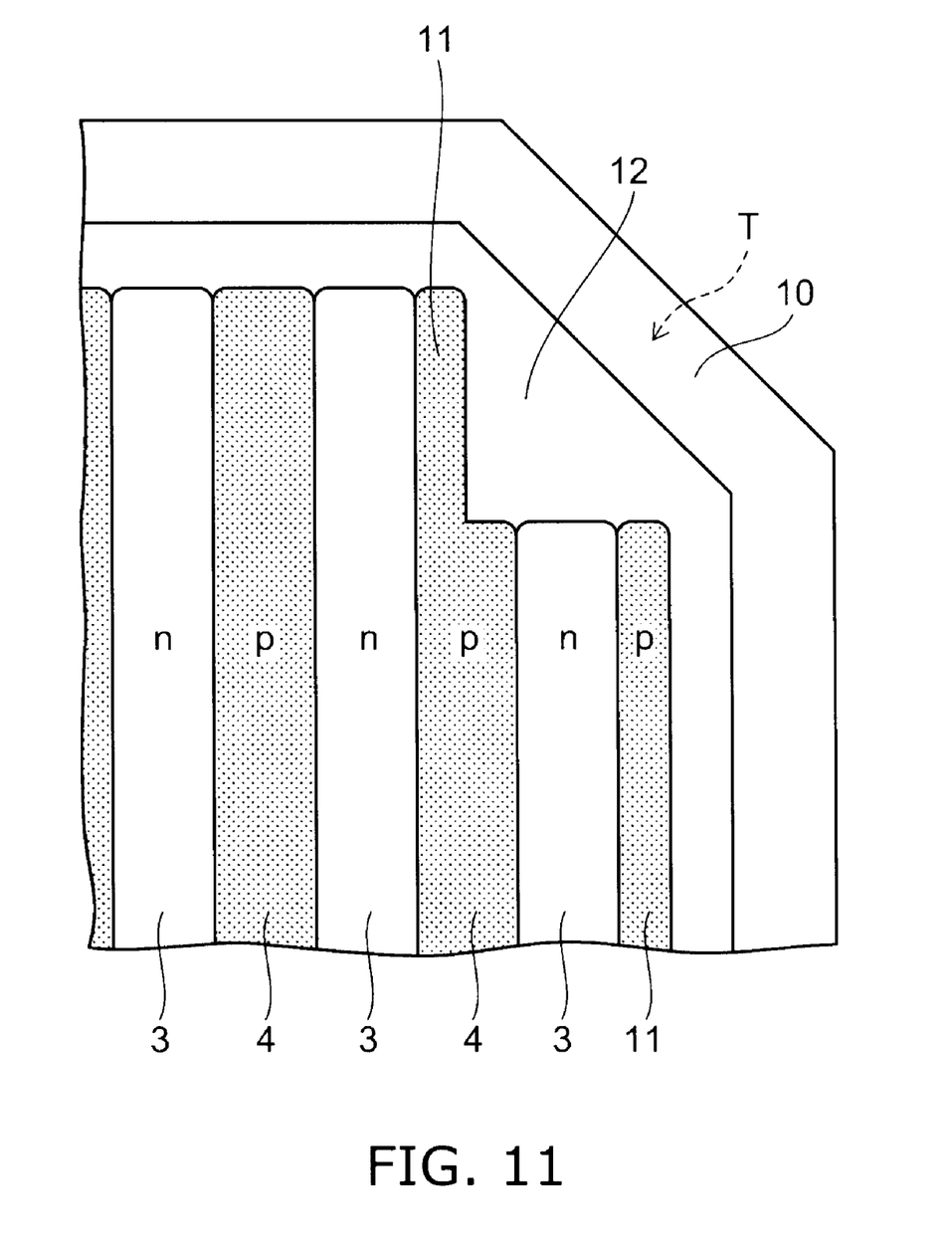
FIG. 11 is a schematic view showing the planar layout of the superjunction structure, the high-resistance layer, the trench, and the insulator at the device corner of a semiconductor device according to a sixth embodiment of the invention.

FIG. 11 is a schematic view showing the planar layout of the superjunction structure, the high-resistance layer 12, the trench T, and the insulator 10 at the device corner of a semiconductor device according to a sixth embodiment of the invention.

As shown in FIG. 11, at the device corner, the trench T is formed obliquely to the periodic direction (horizontal direction in the figure) of the superjunction structure and the stripe extending direction (vertical direction in the figure) of the superjunction structure. That is, the device corner is not squared up, but chamfered. Thus, as compared with the case where the trench T is squared up at the device corner, stress concentration on the device corner can be alleviated to avoid leakage current and the decrease of breakdown voltage at the device corner.

Furthermore, the n-type pillar layer 3 and the p-type pillar layer 4 are formed in a striped configuration, and at the device corner, the outermost pillar layers 11 are formed in a stepped configuration. Thus, the high-resistance layer 12 is interposed between the superjunction structure and the obliquely formed trench T without losing the balance in the amount of impurity in the superjunction structure, achieving high breakdown voltage. The device corner can be chamfered with a plurality of faces. The stepped portion of the superjunction structure can include more steps than in the figure.

While FIG. 11 shows a structure in which the trench T is filled with only the insulator 10, it is also practicable to use the above-described structure in which the trench T is filled with the insulator 10 and polycrystalline silicon 13.

Seventh Embodiment

Figure 12:
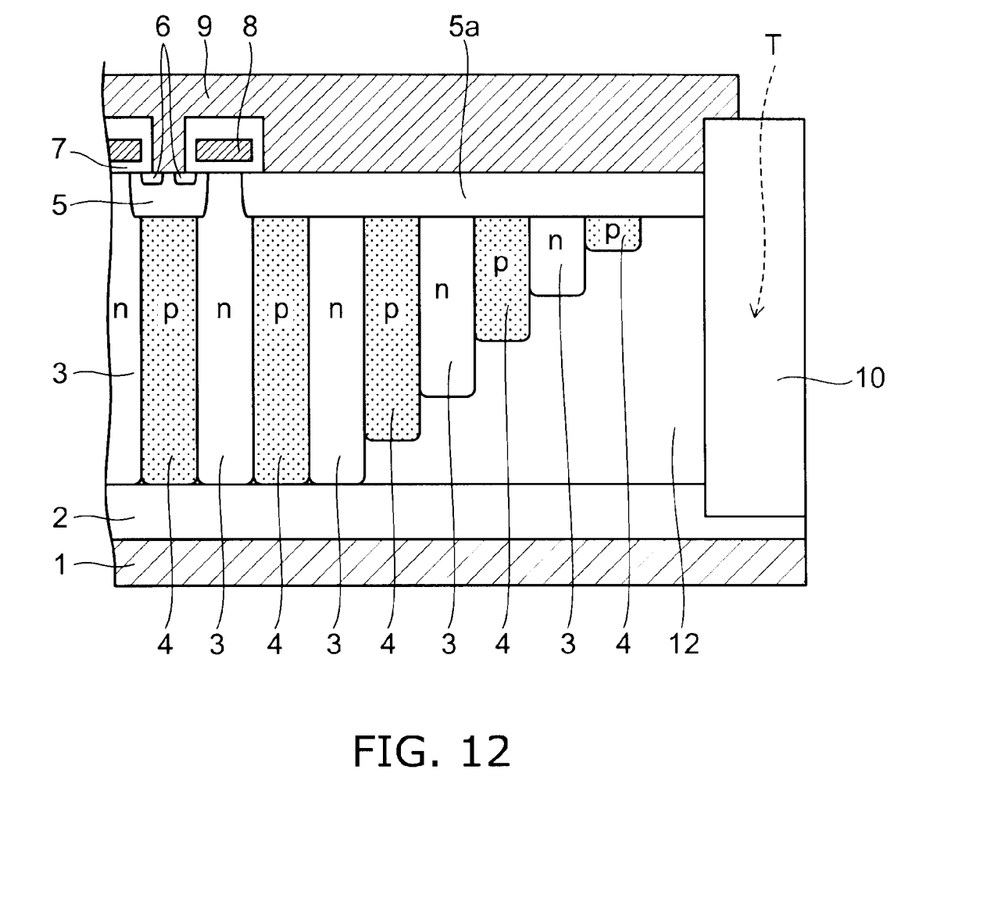
FIG. 12 is a cross-sectional view schematically showing the configuration of a semiconductor device according to a seventh embodiment of the invention.

FIG. 12 is a cross-sectional view schematically showing the configuration of a semiconductor device according to a seventh embodiment of the invention.

In the structure shown in FIG. 12, the depth of the n-type pillar layer 3 and the p-type pillar layer 4 (the depth in the direction from the source electrode 9 to the drain electrode 1) in contact with the high-resistance layer 12 is decreased stepwise toward the trench T.

In the case where the depth of the pillar layer in the superjunction structure is thus varied stepwise, the portions not in contact with another pillar layer on one side, that is, the portions lacking the balance of presence of the pillar layer, are distributed, and hence the decrease of breakdown voltage is reduced. Thus, even without the outermost pillar layer, in which the amount of impurity is half that in the inner pillar layer, a transition structure from the superjunction structure to the high-resistance layer 12 can be realized with no decrease in breakdown voltage.

Also in this embodiment, the high-resistance layer 12 is interposed between the trench T and the stepped pillar layers to prevent the decrease of breakdown voltage due to variation in the amount of impurity in the stepped pillar layers and hold high breakdown voltage.

The embodiments of the invention have been described with reference to the examples. However, the invention is not limited thereto, but can be variously modified within the spirit of the invention.

For instance, in the above embodiments, it is assumed that the first conductivity type and the second conductivity type are n-type and p-type, respectively. However, the invention is practicable also when the first conductivity type and the second conductivity type are p-type and n-type, respectively.

The planar pattern of the MOS gate section and the superjunction structure is not limited to the striped configuration, but can be formed in a lattice or staggered configuration. Furthermore, while the cross sections of the planar gate structure are shown, a trench gate structure can also be used.

The invention is practicable also when the p-type pillar layer 4 is not in contact with the drain layer 2. Furthermore, the invention is practicable also when the superjunction structure is formed on the surface of the substrate on which an n⁻-type layer having a lower impurity concentration than the n-type pillar layer 3 is grown.

In the above description, silicon (Si) is used as the semiconductor in the MOSFETs. However, compound semiconductors such as silicon carbide (SiC) and gallium nitride (GaN), or wide bandgap semiconductors such as diamond can be also used as the semiconductor.

The invention has been described with reference to MOSFETs having a superjunction structure. However, the invention is also applicable to any devices having a superjunction structure, such as an SBD (Schottky barrier diode), a hybrid device of an SBD and a MOSFET, an SIT (static induction transistor), and an IGBT (insulated gate bipolar transistor).

The invention claimed is:

1. A semiconductor device comprising:

a first first-conductivity-type semiconductor layer;

a second first-conductivity-type semiconductor layer provided on a major surface of the first first-conductivity-type semiconductor layer;

a third second-conductivity-type semiconductor layer being adjacent to the second first-conductivity-type semiconductor layer, provided on the major surface of the first first-conductivity-type semiconductor layer, and forming a periodic array structure in combination with the second first-conductivity-type semiconductor layer in a horizontal direction generally parallel to the major surface of the first first-conductivity-type semiconductor layer;

a first main electrode electrically connected to the first first-conductivity-type semiconductor layer;

a fourth second-conductivity-type semiconductor region provided on the third second-conductivity-type semiconductor layer;

a fifth first-conductivity-type semiconductor region selectively provided in a surface of the fourth second-conductivity-type semiconductor region;

a second main electrode provided in contact with the fifth first-conductivity-type semiconductor region and the fourth second-conductivity-type semiconductor region;

a control electrode provided on the fifth first-conductivity-type semiconductor region, the fourth second-conductivity-type semiconductor region, and the second first-conductivity-type semiconductor layer via an insulating film;

a sixth semiconductor layer located outside and adjacent to the periodic array structure of the second first-conductivity-type semiconductor layer and the third second-conductivity-type semiconductor layer, provided on the major surface of the first first-conductivity-type semiconductor layer, and having a lower impurity concentration than the periodic array structure; and a trench being adjacent to the sixth semiconductor layer and having a bottom reaching the first first-conductivity-type semiconductor layer, the amount of impurity in the outermost semiconductor layer of the first conductivity type or the second conductivity type adjacent to the sixth semiconductor layer in the periodic array structure being generally half the amount of impurity in the second first-conductivity-type semiconductor layer or the third second-conductivity-type semiconductor layer inside the outermost semiconductor layer.

2. The semiconductor device according to claim 1, wherein an outermost region in the fourth second-conductivity-type semiconductor region is located on a surface of the sixth semiconductor layer.

3. The semiconductor device according to claim 2, wherein the outermost region of the fourth second-conductivity-type semiconductor region is in contact with the trench.

4. The semiconductor device according to claim 1, wherein the outermost semiconductor layer has the same impurity concentration as the second first-conductivity-type semiconductor layer and the third second-conductivity-type semiconductor layer, and has half the width of the second first-conductivity-type semiconductor layer or the third second-conductivity-type semiconductor layer.

5. The semiconductor device according to claim 1, wherein the trench is filled with an insulator.

6. The semiconductor device according to claim 5, wherein the insulator is silicon oxide.

7. The semiconductor device according to claim 5, wherein the insulator is silicon nitride.

8. The semiconductor device according to claim 5, wherein the insulator is a composite film of silicon oxide and silicon nitride.

9. The semiconductor device according to claim 5, wherein the sixth semiconductor layer is provided also on the major surface of the first first-conductivity-type semiconductor layer outside the trench filled with the insulator.

10. The semiconductor device according to claim 9, wherein the second main electrode is formed to the outside of the trench.

11. The semiconductor device according to claim 5, wherein part of the insulator is provided above the opening end of the trench.

12. The semiconductor device according to claim 11, wherein the second main electrode is formed also on the insulator provided above the opening end of the trench.

13. The semiconductor device according to claim 1, wherein an insulator is provided on an inner wall of the trench, and the inside of the insulator in the trench is filled with polycrystalline silicon.

14. The semiconductor device according to claim 13, wherein the polycrystalline silicon is a floating electrode.

15. The semiconductor device according to claim 13, wherein the polycrystalline silicon is provided also on a surface of a termination section including the trench and the sixth semiconductor layer via a field insulating film.

16. The semiconductor device according to claim 15, wherein the second main electrode covers the polycrystalline silicon via the field insulating film.

17. The semiconductor device according to claim 15, wherein the polycrystalline silicon covers the end of an outermost region in the fourth second-conductivity-type semiconductor region via the field insulating film.

18. The semiconductor device according to claim 1, wherein
the periodic array structure of the second first-conductivity-type semiconductor layer and the third second-conductivity-type semiconductor layer is formed in a striped pattern, and
in a portion corresponding to a corner of the periodic array structure, the trench is formed obliquely to the periodic direction of the periodic array structure and the striped pattern extending direction of the periodic array structure.

19. The semiconductor device according to claim 18, wherein the periodic array structure is formed in a stepped configuration at the corner of the periodic array structure.

20. The semiconductor device according to claim 1, wherein the depth of the second first-conductivity-type semiconductor layer and the third second-conductivity-type semiconductor layer in contact with the sixth semiconductor layer is decreased stepwise toward the trench.

* * * * *